(12) United States Patent
Lu

(10) Patent No.: US 11,398,408 B2
(45) Date of Patent: Jul. 26, 2022

(54) SEMICONDUCTOR SUBSTRATE WITH TRACE CONNECTED TO VIA AT A LEVEL WITHIN A DIELECTRIC LAYER

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 104 days.

(21) Appl. No.: 16/581,018

(22) Filed: Sep. 24, 2019

(65) Prior Publication Data

US 2021/0090947 A1     Mar. 25, 2021

(51) Int. Cl.
| | |
|---|---|
| *H01L 23/48* | (2006.01) |
| *H01L 21/768* | (2006.01) |
| *H01L 21/3213* | (2006.01) |

(52) U.S. Cl.
CPC .. *H01L 21/76879* (2013.01); *H01L 21/32139* (2013.01); *H01L 23/481* (2013.01)

(58) Field of Classification Search
CPC .................. H01L 21/76879; H01L 23/481
See application file for complete search history.

(56) References Cited

U.S. PATENT DOCUMENTS

| | | | | |
|---|---|---|---|---|
| 7,777,323 | B2* | 8/2010 | Kwon | H01L 21/76898 257/686 |
| 8,455,984 | B2* | 6/2013 | Chung | H01L 21/76898 257/621 |
| 9,041,211 | B2* | 5/2015 | Uchiyama | H01L 23/562 257/774 |
| 9,153,522 | B2* | 10/2015 | Moon | H01L 21/76898 |
| 9,209,164 | B2* | 12/2015 | Lee | H01L 25/074 |
| 9,362,139 | B2* | 6/2016 | Ebefors | H01L 23/552 |
| 9,449,875 | B2* | 9/2016 | Chen | H01L 21/76816 |
| 10,438,885 | B1* | 10/2019 | Lu | H01L 21/481 |
| 2006/0278331 | A1* | 12/2006 | Dugas | H01S 5/0425 156/230 |
| 2008/0225501 | A1 | 9/2008 | Cho et al. | |
| 2011/0221069 | A1* | 9/2011 | Kunimoto | H01L 23/5389 257/774 |
| 2014/0103520 | A1* | 4/2014 | Kirby | H01L 23/49827 257/737 |
| 2018/0033732 | A1* | 2/2018 | Sakamoto | H01L 23/5384 |
| 2019/0096798 | A1* | 3/2019 | Aleksov | G06F 30/394 |

\* cited by examiner

*Primary Examiner* — Lex H Malsawma
(74) *Attorney, Agent, or Firm* — Foley & Lardner LLP

(57) ABSTRACT

A semiconductor substrate and a method of manufacturing the same are provided. The semiconductor substrate includes a dielectric layer, at least one first conductive trace, and a conductive via. The dielectric layer has a first dielectric surface and a second dielectric surface opposite to the first dielectric surface. The first conductive trace is disposed adjacent to the first dielectric surface of the dielectric layer. The conductive via is disposed adjacent to the second dielectric surface of the dielectric layer and connected to the first conductive trace, where the conductive via and the first conductive trace are connected at a first interface leveled with about a half thickness of the dielectric layer.

19 Claims, 11 Drawing Sheets

__US 11,398,408 B2__

SEMICONDUCTOR SUBSTRATE WITH TRACE CONNECTED TO VIA AT A LEVEL WITHIN A DIELECTRIC LAYER

BACKGROUND

1. Technical Field

The present disclosure relates to a semiconductor substrate and a method of manufacturing the same and, more particularly, to a semiconductor substrate that includes improved interconnecting conductive trace structures.

2. Description of the Related Art

There is a continuing desire to reduce dimensions of a semiconductor substrate and incorporating more and more conductive traces into the substrate. It would therefore be desirable to provide semiconductor substrates that can incorporate more conductive traces and at the same time satisfy the miniaturization demand.

SUMMARY

In an aspect, a semiconductor substrate includes a dielectric layer, at least one first conductive trace, and a conductive via. The dielectric layer has a first dielectric surface and a second dielectric surface opposite to the first dielectric surface. The first conductive trace is disposed adjacent to the first dielectric surface of the dielectric layer. The conductive via is disposed adjacent to the second dielectric surface of the dielectric layer and connected to the first conductive trace, where the conductive via and the first conductive trace are connected at a first interface leveled with about a half thickness of the dielectric layer.

In an aspect, a semiconductor substrate includes a dielectric layer, a first conductive trace, a second conductive trace, and a conductive via. The dielectric layer has a first dielectric surface and a second dielectric surface opposite to the first dielectric surface. The first conductive trace is disposed adjacent to the first dielectric surface of the dielectric layer. The second conductive trace is disposed adjacent to the first dielectric surface of the dielectric layer. The conductive via is disposed adjacent to the second dielectric surface of the dielectric layer, where the first conductive trace and the second conductive trace are connected to the conductive via.

In an aspect, a method of manufacturing a semiconductor substrate includes: providing a carrier having a surface; patterning a first masking layer over the surface; forming a first conductive trace having a first thickness through the first masking layer; patterning a second masking layer over the surface and covering the first conductive trace; and forming a second conductive trace having a second thickness through the second masking layer, wherein the first thickness is different from the second thickness.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a semiconductor substrate including a dielectric layer, at least one first conductive trace, and a conductive via, where the interface between the first conductive trace and the conductive via and leveled within the thickness of the dielectric layer is moved from a first dielectric surface of the dielectric layer to the opposite second dielectric surface of the dielectric layer so that the conductive via will not occupy too much space and can spare some space to accommodate more conductive traces and/or conductive vias.

Figure 1:
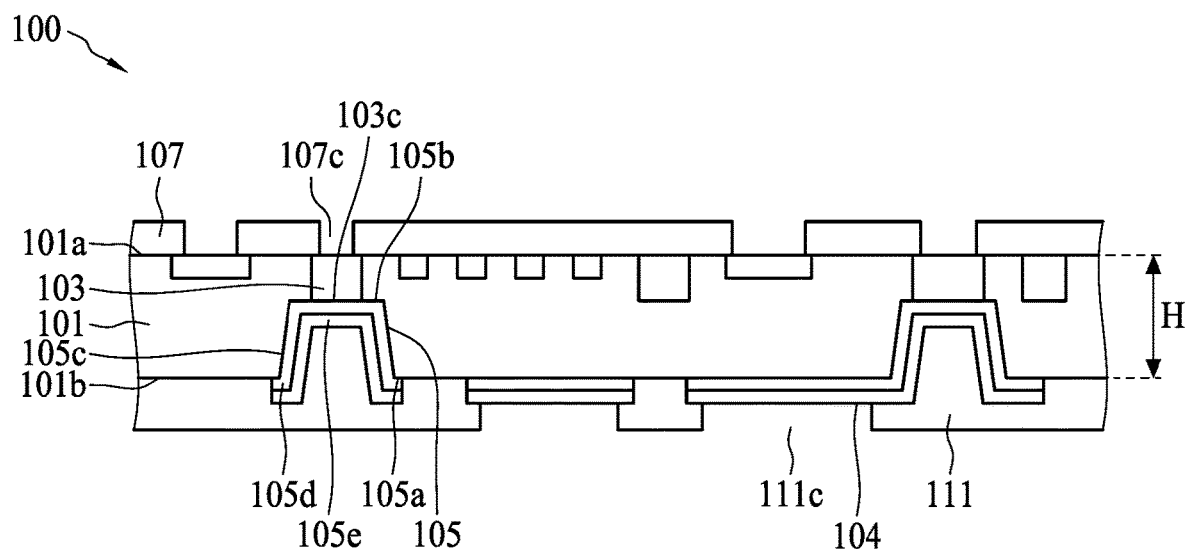
FIG. 1 illustrates a cross-sectional view of a semiconductor substrate according to an embodiment of the present disclosure.

FIG. 1 illustrates a cross-sectional view of a semiconductor substrate 100 according to an embodiment of the present disclosure. The semiconductor substrate 100 of FIG. 1 includes a dielectric layer 101, at least one first conductive trace 103, and a conductive via 105.

The dielectric layer 101 has a first dielectric surface 101a and a second dielectric surface 101b opposite to the first dielectric surface 101a. The dielectric layer 101 has a thickness H extending from the first dielectric surface 101a of the first dielectric layer 101 to the second dielectric surface 101b of the first dielectric layer 101. The dielectric layer 101 may be a single layer or a multilayer structure including more than one the dielectric layers with the same or different structures. The dielectric layer 101 may include, for example, one of, or a combination of, a photosensitive material (e.g., polyimide (PI), polyamide (PA), or other suitable materials), an epoxy material, a resin material (e.g., Ajinomoto Build-up Film (ABF)), cyclophentadiene (CPD), poly-p-phenylene benzobisoxazole (PBO), a solder mask material, a fiber, and an inorganic material (e.g., $Ta_2O_5$, $SiO_2$, $Si_3N_4$, or other suitable materials). In some embodiments, the dielectric layer 101 includes PA. In some embodiments, the dielectric layer 101 includes PI and fiber.

The first conductive trace 103 is disposed adjacent to the first dielectric surface 101a of the dielectric layer 101. In some embodiments, at least a portion of the first conductive trace 103 is disposed in the dielectric layer 101. In some embodiments, the first conductive trace 103 is exposed from the first dielectric surface 101a of the dielectric layer 101. Alternatively, the first conductive trace 103 is embedded in the first dielectric surface 101a of the dielectric layer 101. In some embodiments, the first conductive trace 103 has a thickness of about one fourth of the thickness H of the dielectric layer 101. In some embodiments, the first conductive trace 103 has a thickness of about one third of the thickness H of the dielectric layer 101. In some embodiments, the first conductive trace 103 has a thickness of about a half of the thickness H of the dielectric layer 101. In some embodiments, the first conductive trace 103 has a thickness of about two third of the thickness H of the dielectric layer 101. In some embodiments, the first conductive trace 103 has a thickness of about three fourth of the thickness H of the dielectric layer 101.

In some embodiments, the first conductive trace 103 extends from the first dielectric surface 101a of the dielectric layer 101 to about one fourth of the thickness H of the dielectric layer 101. In some embodiments, the first conductive trace 103 extends from the first dielectric surface 101a of the dielectric layer 101 to about one third of the thickness H of the dielectric layer 101. In some embodiments, the first conductive trace 103 extends from the first dielectric surface 101a of the dielectric layer 101 to about a half of the thickness H of the dielectric layer 101. In some embodiments, the first conductive trace 103 extends from the first dielectric surface 101a of the dielectric layer 101 to about two third of the thickness H of the dielectric layer 101. In some embodiments, the first conductive trace 103 extends from the first dielectric surface 101a of the dielectric layer 101 to about three fourth of the thickness H of the dielectric layer 101. The first conductive trace 103 may be a pillar and/or a coarse conductive line. The first conductive trace 103 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The conductive via 105 is disposed adjacent to the second dielectric surface 101b of the dielectric layer 101. The conductive via 105 has a via bottom surface 105b, a via opening 105a opposite to the via bottom surface 105b, and a via side surface 105c extending from the via bottom surface 105b to the via opening 105a. The via side surface 105c may incline inwardly from the via opening 105a of the conductive via 105 to the via bottom surface 105b so the via opening 105a of the conductive via 105 may have a larger projection area than the via bottom surface 105b.

The conductive via 105 may electrically connect to the first conductive trace 103. In some embodiments, the first conductive trace 103 is disposed adjacent to an edge of a via bottom surface 105b of the conductive via 105. The conductive via 105 may be exposed from the second dielectric surface 101b of the dielectric layer 101. Alternatively, the conductive via 105 may not be exposed from the second dielectric surface 101b of the dielectric layer 101. In some embodiments, the first conductive trace 103 is exposed from the first dielectric surface 101a of the dielectric layer 101, the conductive via 105 is exposed from the second dielectric surface 101b of the dielectric layer 101, and the conductive via 105 electrically connects to the first conductive trace 103 so an electrical signal may be transmitted from one side of the dielectric layer 101 to the other side of the dielectric layer 101.

The conductive via 105 and the first conductive trace 103 are connected at a first interface 103c leveled with a thickness smaller than the thickness H of the dielectric layer 101. In some embodiments, the conductive via 105 and the first conductive trace 103 are connected at a first interface 103c leveled with about one fourth of the thickness H of the dielectric layer 101. In some embodiments, the conductive via 105 and the first conductive trace 103 are connected at a first interface 103c leveled with about a half of the thickness H of the dielectric layer 101. In some embodiments, the conductive via 105 and the first conductive trace 103 are connected at a first interface 103c leveled with about two third of the thickness H of the dielectric layer 101. In some embodiments, the conductive via 105 and the first conductive trace 103 are connected at a first interface 103c leveled with about three fourth of the thickness H of the dielectric layer 101. By moving the connection interface 103c between the first conductive trace 103 and the conductive via 105 from the first dielectric surface 101a of the dielectric layer 101 toward the opposite second dielectric surface 101b of the dielectric layer 101 (e.g., by increasing the thickness of the first conductive trace 103 and/or by decreasing the thickness of the conductive via 105), the protection area of the via bottom surface 105b of the conductive via 105 can become larger so it may have more space to accommodate more than one conductive traces. In addition, since the connection interface 103c between the first conductive trace 103 and the conductive via 105 is moved from the first dielectric surface 101a toward the opposite second dielectric surface 101b of the dielectric layer 101, the conductive via 105 that is embedded in the first dielectric surface 101a of the dielectric layer 101 may spare more space for accommodating more traces in the projection area of the via bottom surface 105b of the conductive via 105 on the first dielectric surface 101a as the conductive via 105 occupies less space.

The conductive via 105 may include a first metal layer 105d and a second metal layer 105e. The second metal layer 105e may be disposed adjacent to the first metal layer 105d. In some embodiments, the second metal layer 105e is disposed on the first metal layer 105d. In some embodiments, the second metal layer 105e is lining with the first metal layer 105d. In some embodiments, the first metal layer 105d is a metal seed layer. The first metal layer 105d and the second metal layer 105e may independently include, for example, one of, or a combination of, copper, gold, indium, tin, silver, palladium, osmium, iridium, ruthenium, titanium, magnesium, aluminum, cobalt, nickel, or zinc, or other metals or metal alloys. The material of the first metal layer 105d and that of the second metal layer 105e may be the same or different.

In some embodiments, such as the one illustrated in FIG. 1, the semiconductor substrate 100 may further include a second conductive trace 104 disposed adjacent to the second dielectric surface 101b of the dielectric layer 101. In some embodiments, the second conductive trace 104 is exposed from the second dielectric surface 101b of the dielectric layer 101. In some embodiments, the second conductive trace 104 is disposed on the second dielectric surface 101b of the dielectric layer 101. The second conductive trace 104 may electrically connect to the conductive via 105. The second conductive trace 104 may include, for example, one of, or a combination of, copper, gold, indium, tin, silver, palladium, osmium, iridium, ruthenium, titanium, magnesium, aluminum, cobalt, nickel, or zinc, or other metals or metal alloys.

In some embodiments, such as the one illustrated in FIG. 1, the semiconductor substrate 100 may further include a first protective layer 107 disposed adjacent to the first dielectric surface 101a of the dielectric layer 101. In some embodiments, the first protective layer 107 is disposed on (e.g., physical contact) the first dielectric surface 101a of the dielectric layer 101. The first protective layer 107 may expose at least a portion of the first conductive trace 103 by defining a first protective opening 107c. Alternatively, the first protective layer 107 may cover the entire first conductive trace 103. The first protective layer 107 may be a photosensitive layer (e.g., a solder mask material or other suitable materials), a passivation layer, or an insulation layer (the material of which may be silicon oxide or silicon nitride, or another insulation material).

In some embodiments, such as the one illustrated in FIG. 1, the semiconductor substrate 100 may further include a second protective layer 111 disposed adjacent to the second dielectric surface 101b of the dielectric layer 101. In some embodiments, the second protective layer 111 is disposed on (e.g., physical contact) the second dielectric surface 101b of the dielectric layer 101. The second protective layer 111 may expose at least a portion of the second conductive trace 104 by defining a second protective opening 111c. Alternatively, the second protective layer 111 may cover the entire second conductive trace 104. In some embodiments, the first conductive trace 103 is exposed from the first dielectric surface 101a of the dielectric layer 101 and the first protective layer 107 through the first protective opening 107c, the conductive via 105 electrically connects to the second conductive trace 104, and the second conductive trace 104 is exposed from the second dielectric surface 101b of the dielectric layer 101 and the second protective layer 111 through the second protective opening 111c, so an electrical signal may be transmitted from one side of the dielectric layer 101 to the other side of the dielectric layer 101. The second protective layer 111 may be a photosensitive layer (e.g., a solder mask material or other suitable materials), a passivation layer, or an insulation layer (the material of which may be silicon oxide or silicon nitride, or another insulation material).

Figure 2A:
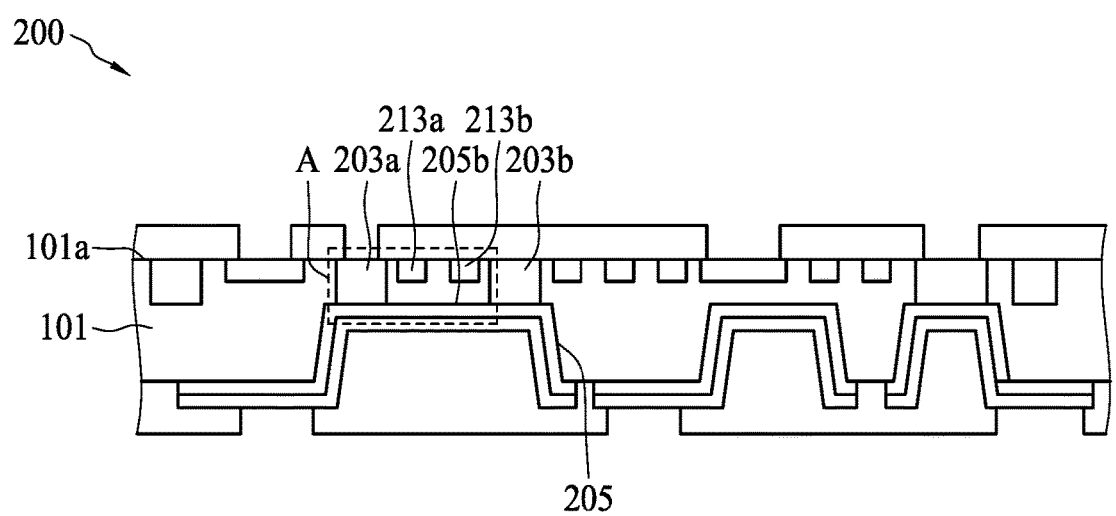
FIG. 2A illustrates a cross-sectional view of a semiconductor substrate according to an embodiment of the present disclosure.

FIG. 2A illustrates a cross-sectional view of a semiconductor substrate 200 according to an embodiment of the present disclosure. The semiconductor substrate 200 is similar to that illustrated in FIG. 1, with a difference including that the conductive via 205 electrically connects to at least two first conductive traces 203a, 203b and at least one third conductive trace 213a, 213b is disposed in the projection area of the via bottom surface 205b of the conductive via 205.

In some embodiments, such as the one illustrated in FIG. 2A, at least one of the first conductive traces 203a, 203b may be disposed adjacent to an edge of the via bottom surface 205b of the conductive via 205. The first conductive traces 203a, 203b may be spaced from each other by a distance, so another conductive trace or conductive via may be disposed between them. In some embodiments, at least one of the first conducive traces 203a, 203b electrically connects to the edge of the via bottom surface 205b of the conductive via 205.

The third conductive trace 213a, 213b may be disposed adjacent to the first dielectric surface 101a of the dielectric layer 101. In some embodiments, at least a portion of the third conductive trace 213a, 213b is disposed in the dielectric layer 101. In some embodiments, the third conductive trace 213a, 213b is exposed from the first dielectric surface 101a of the dielectric layer 101. Alternatively, the third conductive trace 213a, 213b is embedded in the first dielectric surface 101a of the dielectric layer 101. The third conductive trace 213a, 213b may be disposed in the projection area of the via bottom surface 205b of the conductive via 205. The third conductive trace 213a, 213b may be disposed adjacent to a center in the projection area of the via bottom surface 205b of the conductive via 205. In some embodiments, the third conductive trace 213a, 213b is disposed between the first conductive traces 203a, 203b.

The third conductive trace 213a, 213b may have a thickness substantially the same or different from the first conductive traces 203a, 203b. In some embodiments, the third conductive trace 213a, 213b has a thickness smaller than at least one of the first conductive traces 203a, 203b. By disposing at least one of the first conductive traces 213a, 213b with a thickness greater than an adjacent conductive trace (e.g., the third conductive trace 213a, 213b), a space may be formed between the first conductive traces 203a, 203b, which may accommodate additional conductive traces (e.g., the third conductive trace 213a, 213b) and allow them to pass through. As a result, the trace density (per area) may be increased. The third conductive trace 213a, 213b may include, for example, one of, or a combination of, copper, gold, indium, tin, silver, palladium, osmium, iridium, ruthenium, titanium, magnesium, aluminum, cobalt, nickel, or zinc, or other metals or metal alloys.

Figure 2B:
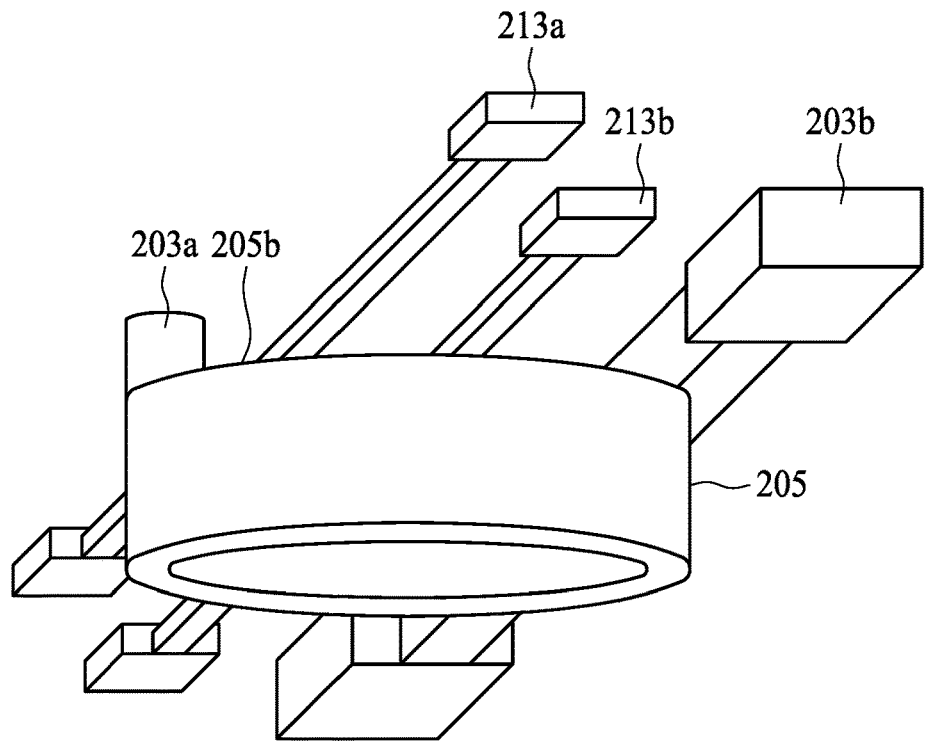
FIG. 2B illustrates a perspective view of region A of the semiconductor substrate illustrated in FIG. 2A.

FIG. 2B illustrates a perspective view of region A of the semiconductor substrate 200 illustrated in FIG. 2A with some elements being removed, for the purpose of description. In FIG. 2B, the conductive via 205 electrically connects to at least two first conductive traces 203a, 203b and at least one third conductive trace 213a, 213b is disposed in the projection area of the via bottom surface 205b of the conductive via 205. The third conductive trace 213a, 213b may be disposed between the first conductive traces 203a, 203b and adjacent to a center in the projection area of the via bottom surface 205b of the conductive via 205. In some embodiments, the third conductive trace 213a, 213b passes through in the projection area of the via bottom surface 205b of the conductive via 205 and between the two first conductive traces 203a, 203b. In some embodiments, at least one of the first conductive traces 203a, 203b is a pillar. In some embodiments, at least two of the first conductive traces 203a, 203b are pillars. In some embodiments, at least one of the first conductive traces 203a, 203b is a pillar and at least one of the first conductive traces 203a, 203b is a coarse conductive line.

Figure 3:
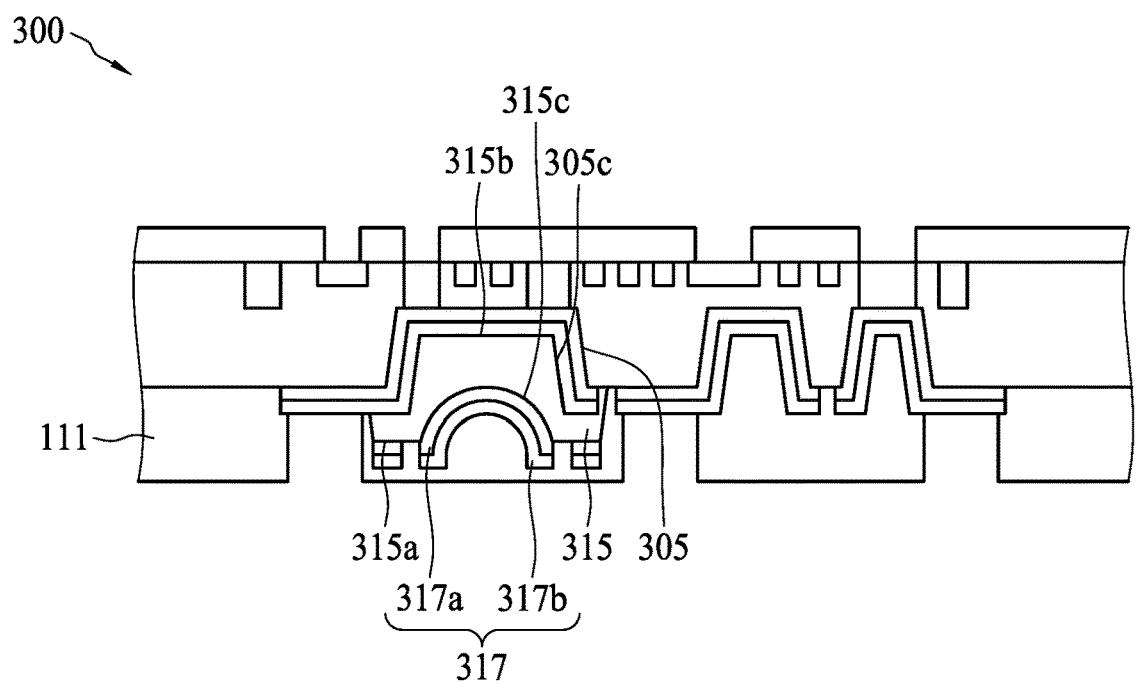
FIG. 3 illustrates a cross-sectional view of a semiconductor substrate according to an embodiment of the present disclosure.

FIG. 3 illustrates a cross-sectional view of a semiconductor substrate 300 according to an embodiment of the present disclosure. The semiconductor substrate 300 is similar to that illustrated in FIG. 2A, with a difference including that an isolation layer 315 is disposed adjacent to the conductive via 305 and a fourth conductive trace 317 is disposed adjacent to the isolation layer 315.

In some embodiments, such as the one illustrated in FIG. 3, the isolation layer 315 is disposed on the conductive via 305. In some embodiments, the isolation layer 315 is disposed in the opening 305c defined by the conductive via 305. In some embodiments, the isolation layer 315 is lining with the conductive via 305. In some embodiments, the isolation layer 315 has a cavity 315c. The isolation layer 315 may include, for example, a photosensitive material (e.g., polyamide (PA) or other suitable materials).

In some embodiments, such as the one illustrated in FIG. 3, the fourth conductive trace 317 is disposed on the isolation layer 315. In some embodiments, the fourth conductive trace 317 is disposed in the cavity 315c defined by the isolation layer 315. In some embodiments, the fourth conductive trace 317 is lining with the isolation layer 315. The fourth conductive trace 317 may be exposed from the second protective layer 111. Alternatively, the fourth conductive trace 317 may be embedded in the second protective layer 111. In some embodiments, the fourth conductive trace 317 is embedded in the second protective layer 111. In some embodiments, the second protective layer 111 fully covers the fourth conductive trace 317.

The fourth conductive trace 317 may include a third metal layer 317a and a fourth metal layer 317b. The third metal layer 317a may be disposed adjacent to the isolation layer 315. In some embodiments, the third metal layer 317a is disposed on the isolation layer 315. In some embodiments, the third metal layer 317a is lining with the isolation layer 315. The fourth metal layer 317b may be disposed adjacent to the third metal layer 317a. In some embodiments, the fourth metal layer 317b is lining with the third metal layer 317a. In some embodiments, the third metal layer 317a is a metal seed layer. The third metal layer 317a and the fourth metal layer 317b may independently include, for example, one of, or a combination of, copper, gold, indium, tin, silver, palladium, osmium, iridium, ruthenium, titanium, magnesium, aluminum, cobalt, nickel, or zinc, or other metals or metal alloys. The material of the third metal layer 317a and the fourth metal layer 317b may be the same or different.

Figure 4:
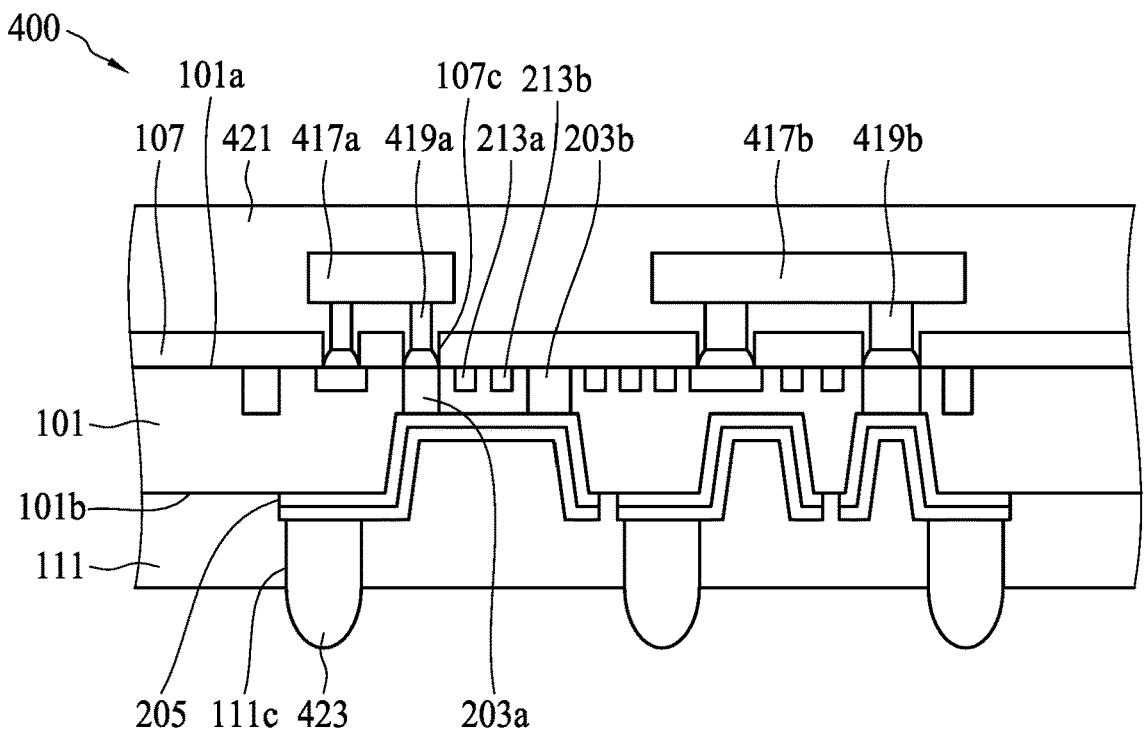
FIG. 4 illustrates a cross-sectional view of a semiconductor substrate according to an embodiment of the present disclosure.

FIG. 4 illustrates a cross-sectional view of a semiconductor substrate 400 according to an embodiment of the present disclosure. The semiconductor substrate 400 is similar to that illustrated in FIG. 2A, with a difference including that at least one semiconductor element 417a, 417b is disposed adjacent to the first dielectric surface 101a of the dielectric layer 101 and at least one electrical connector 423 is disposed adjacent to the second dielectric surface 101b of the dielectric layer 101.

The semiconductor element 417a, 417b may be a chip, a die, a package, an interposer, or a combination thereof. The semiconductor element 417a, 417b may be disposed adjacent to the first protective layer 107. The semiconductor element 417a, 417b may be disposed in the first protective opening 107c defined by the first protective layer 107 and electrically connects to the dielectric layer 101 by disposing at least one conductive terminal 419a, 419b between the semiconductor element 417a, 417b and the first conductive trace 203a, 203b or the third conductive trace 213a, 213b.

The conductive terminal 419a, 419b may be, for example, a solder ball or a pillar structure, which may include an under bump metallization (UBM) layer, a pillar, a barrier layer, a solder layer, or a combination of two or more thereof. The UBM layer may include, for example, a solder material. The pillar may include, for example, a copper. The barrier layer may include, for example, a nickel. In some embodiments, the conductive terminal 419a, 419b is a pillar structure.

The electrical connector 423 is disposed in the second protective opening 111c defined by the second protective layer 111 for external connection. The electrical connector 423 may be a solder ball.

In some embodiments, such as the one illustrated in FIG. 4, the semiconductor substrate 400 may further include an encapsulant 421 disposed adjacent to the first dielectric surface 101a of the dielectric layer 101. In some embodiments, the encapsulant 421 is disposed on the first protective layer 107. In some embodiments, the encapsulant 421 covers a portion of the first protective layer 107 and a portion of the semiconductor element 417a, 417b. In some embodiments, the encapsulant 421 covers a portion of the first protective layer 107 and a portion of the top surface of the semiconductor element 417a, 417b. In some embodiments, the encapsulant 421 covers a portion of the first protective layer 107 and the entire top surface of the semiconductor element 417a, 417b. In some embodiments, the encapsulant 421 covers a portion of the first protective layer 107 and exposes the entire top surface of the semiconductor element 417a, 417b. In some embodiments, the encapsulant 421 covers a portion of the first protective layer 107 and selectively exposes a portion of the semiconductor element 417a, 417b. In some embodiments, the semiconductor element 417a, 417b is embedded in the encapsulant 421.

Figure 5:
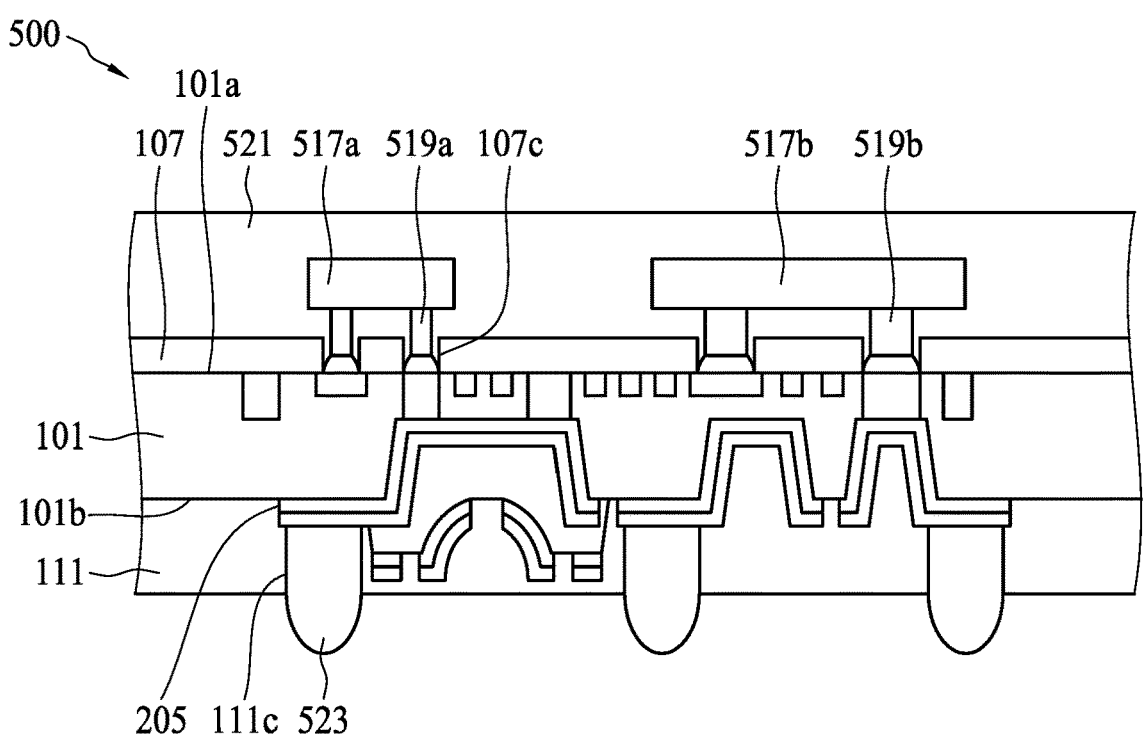
FIG. 5 illustrates a cross-sectional view of a semiconductor substrate according to an embodiment of the present disclosure.

FIG. 5 illustrates a cross-sectional view of a semiconductor substrate 500 according to an embodiment of the present disclosure. The semiconductor substrate 500 is similar to that illustrated in FIG. 3, with a difference including that at least one semiconductor element 517a, 517b is disposed adjacent to the first dielectric surface 101a of the dielectric layer 101 and at least one electrical connector 523 is disposed adjacent to the second dielectric surface 101b of the dielectric layer 101.

The semiconductor element 517a, 517b and the electrical connector 523 are similar to those described and illustrated in FIG. 4, which are not described repeatedly for brevity.

In some embodiments, such as the one illustrated in FIG. 5, the semiconductor substrate 500 may further include an encapsulant 521 disposed adjacent to the first dielectric surface 101a of the dielectric layer 101. The encapsulant 521 is similar to that described and illustrated in FIG. 4, which are not described repeatedly for brevity.

Figure 6A:
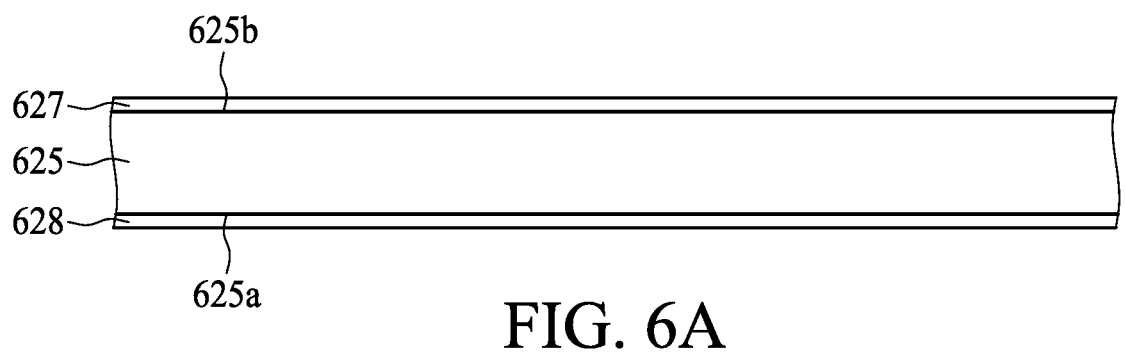
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O illustrate a method for manufacturing a semiconductor substrate such as the semiconductor substrate of FIG. 5.
Figure 6B:
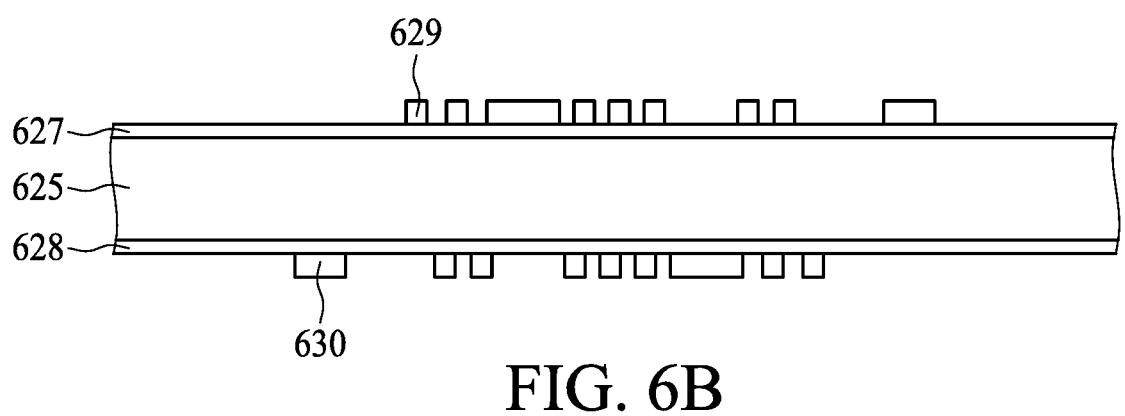
Figure 6C:
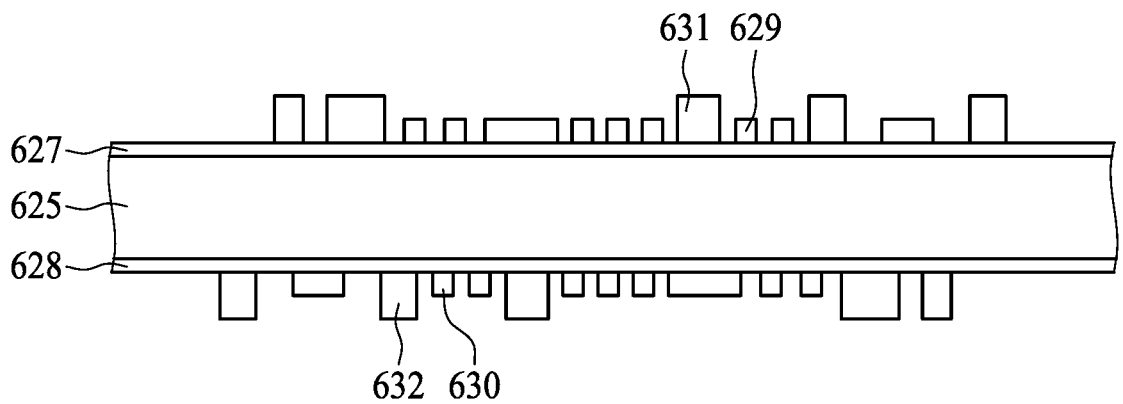
Figure 6D:
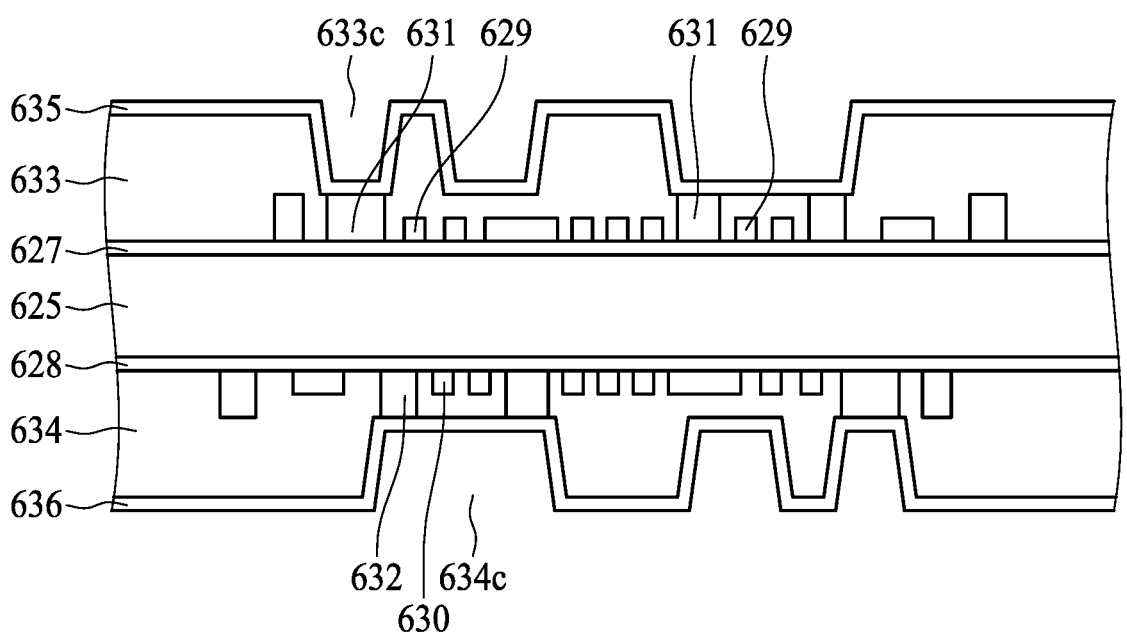
Figure 6E:
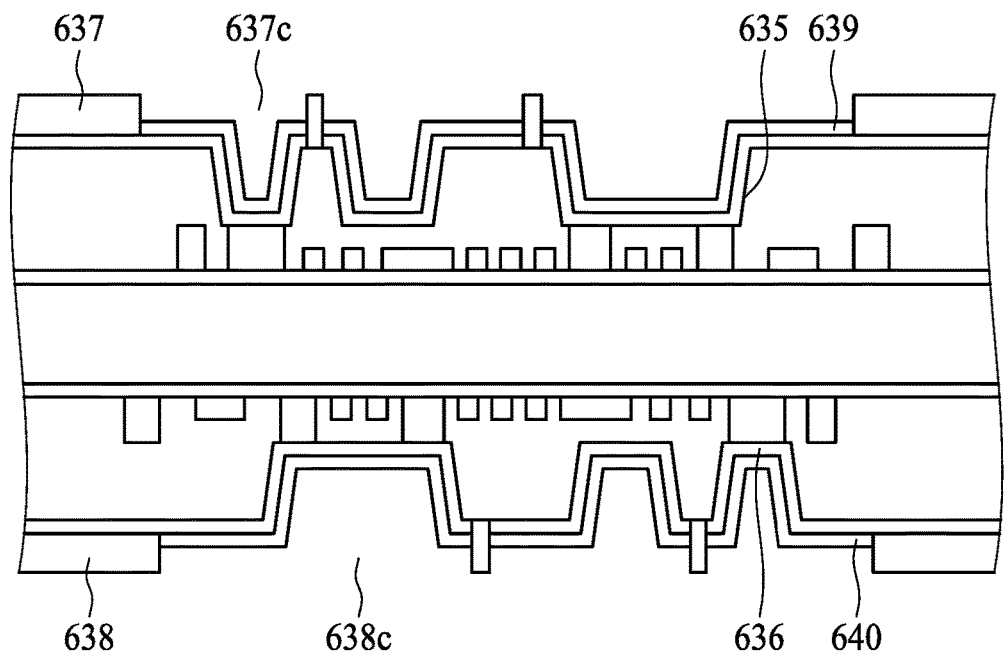
Figure 6F:
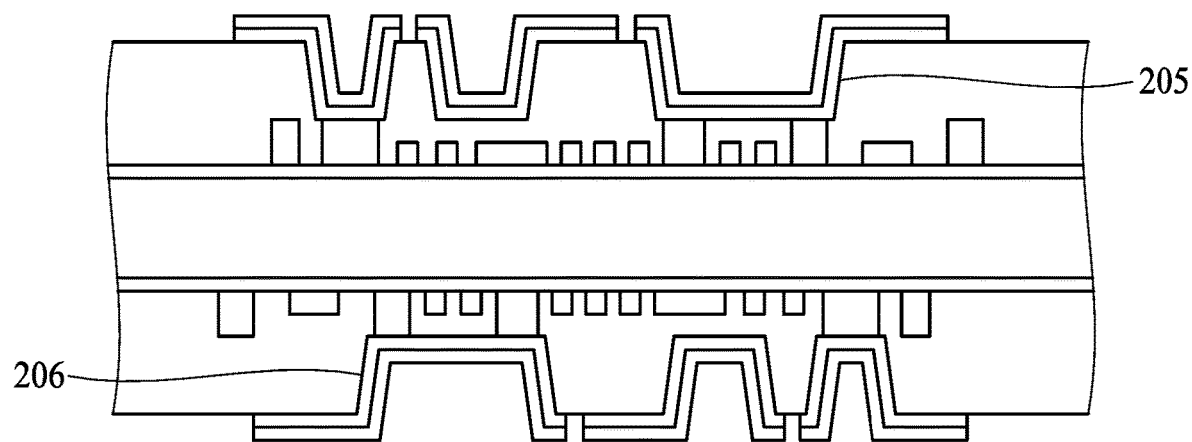
Figure 6G:
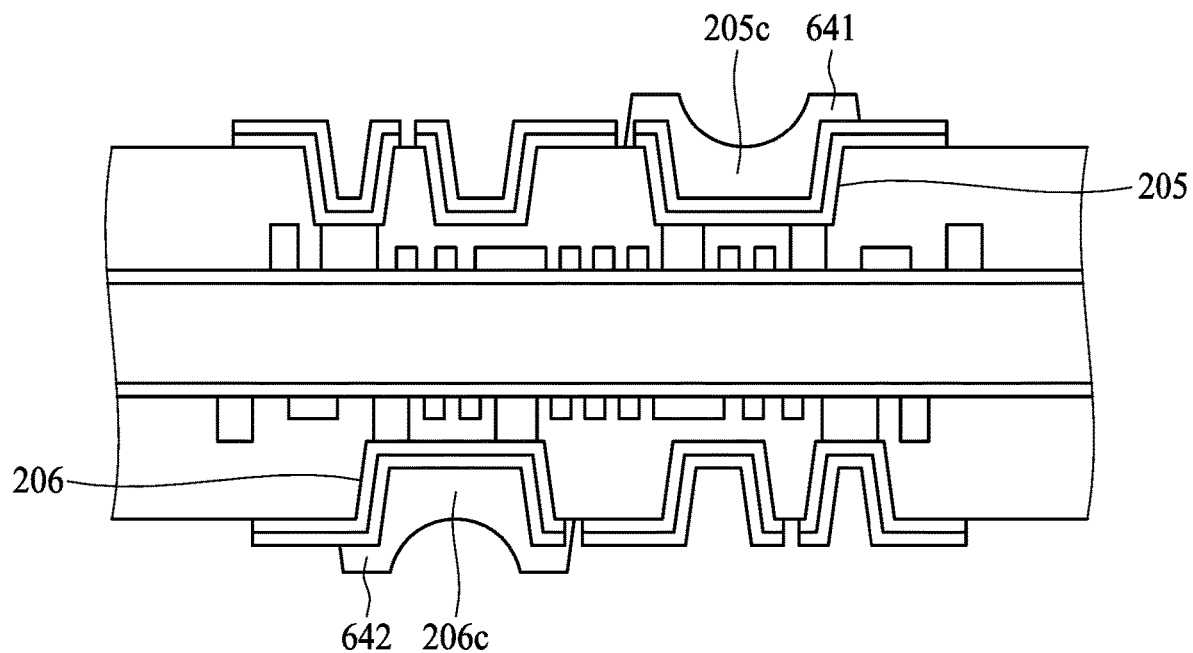
Figure 6H:
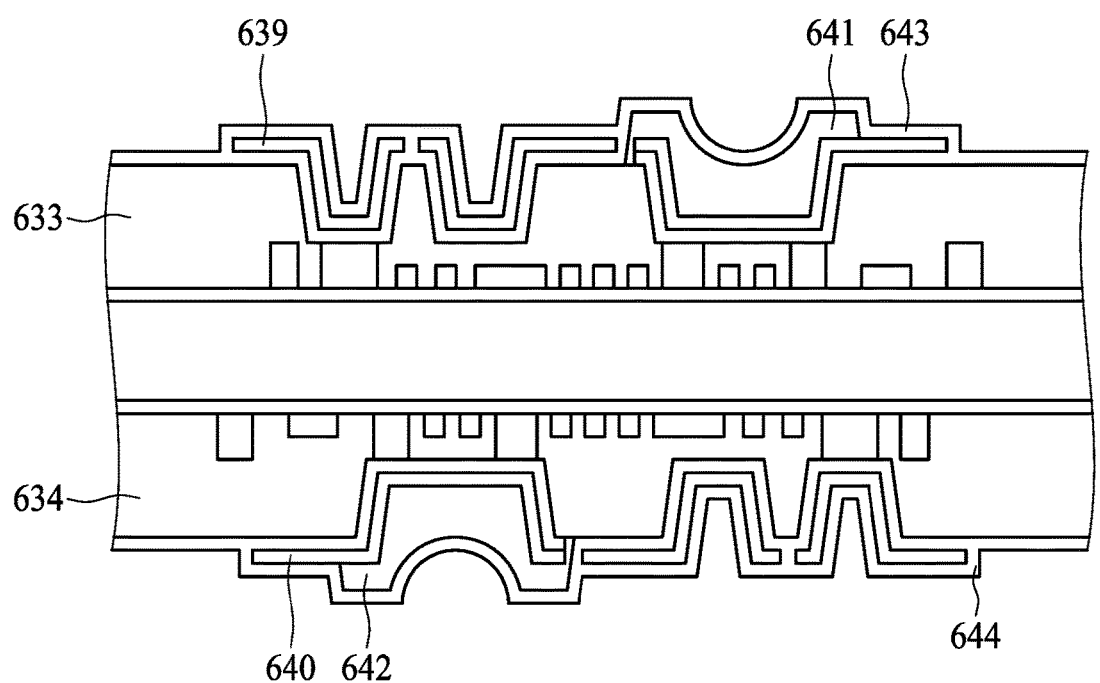
Figure 6I:
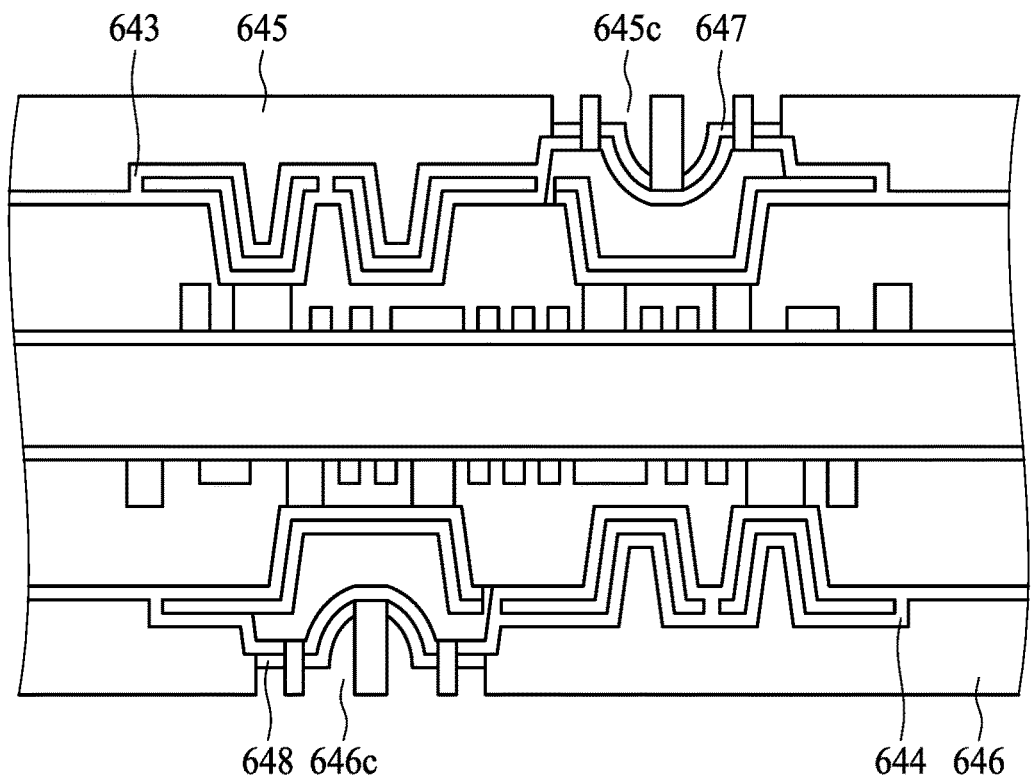
Figure 6J:
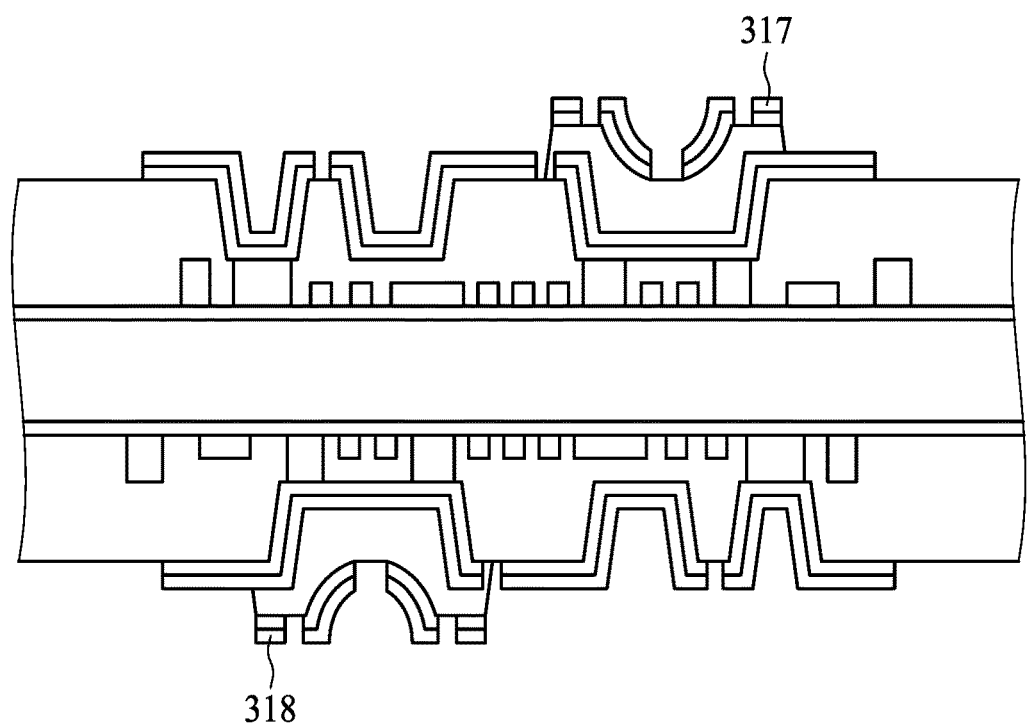
Figure 6K:
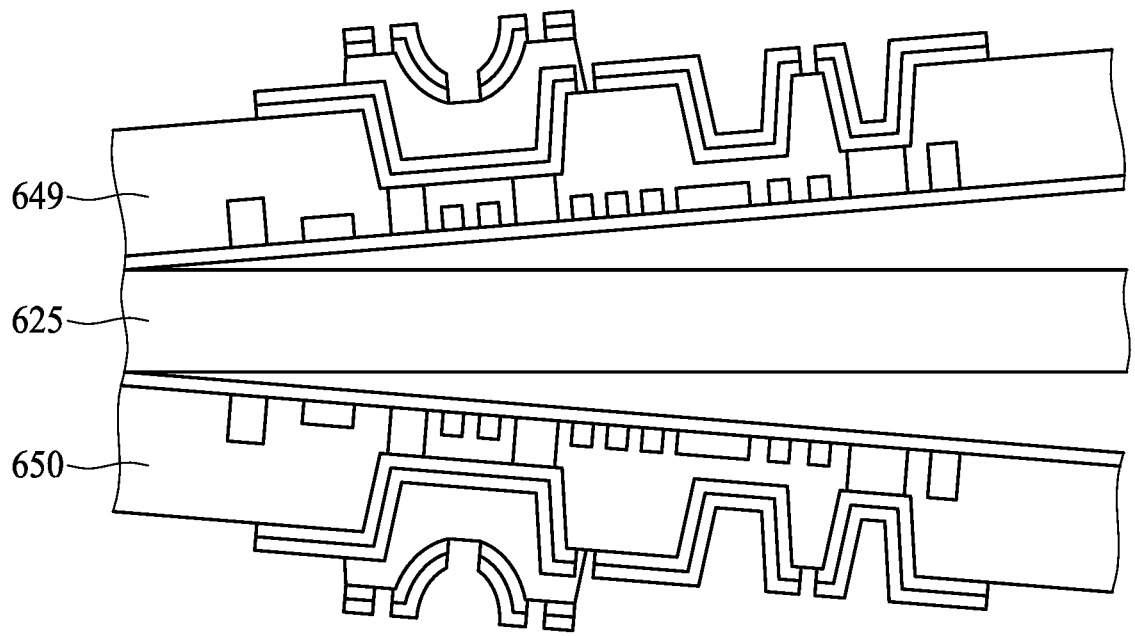
Figure 6L:
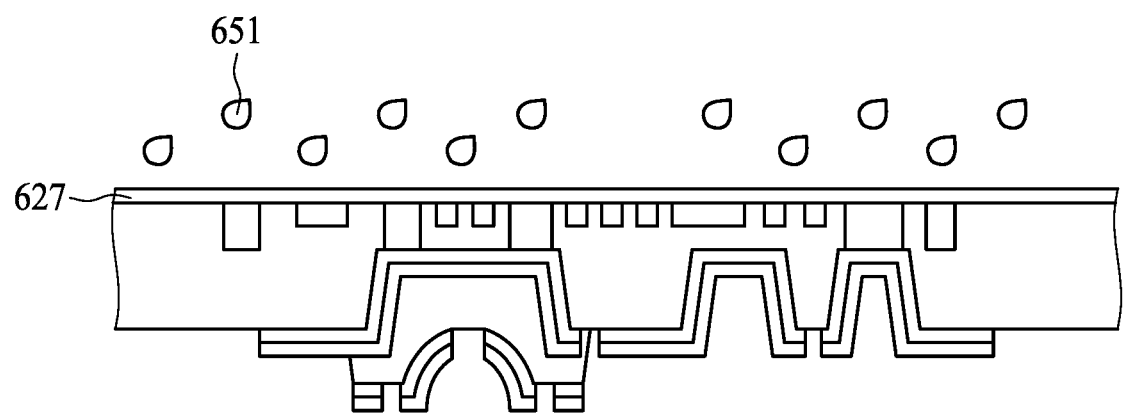
Figure 6M:
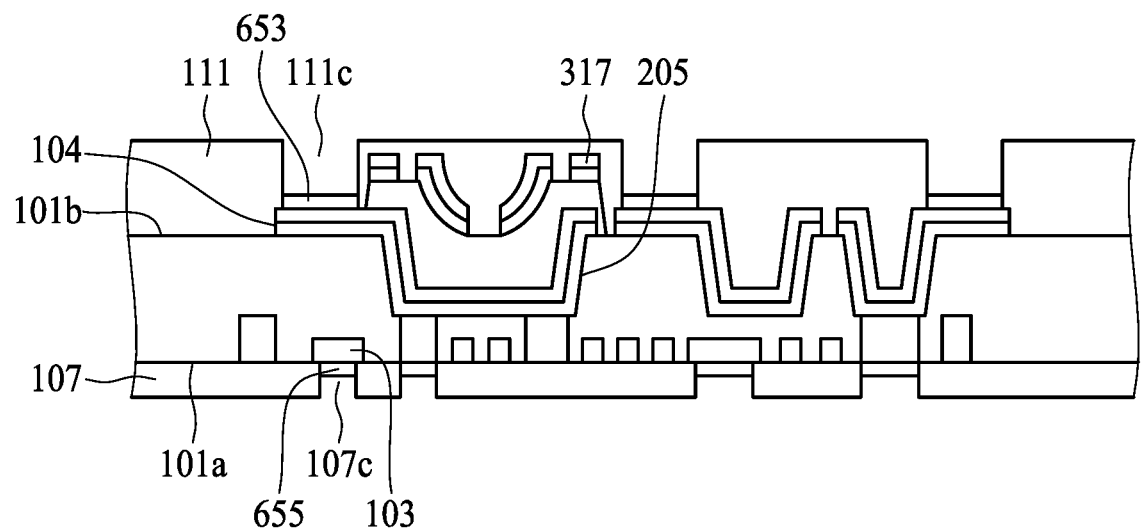
Figure 6N:
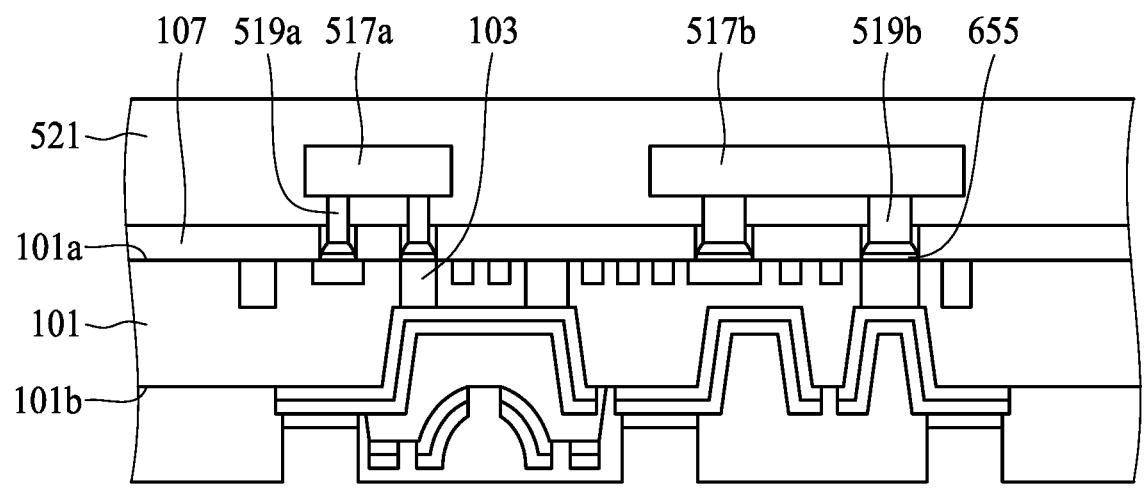
Figure 6O:
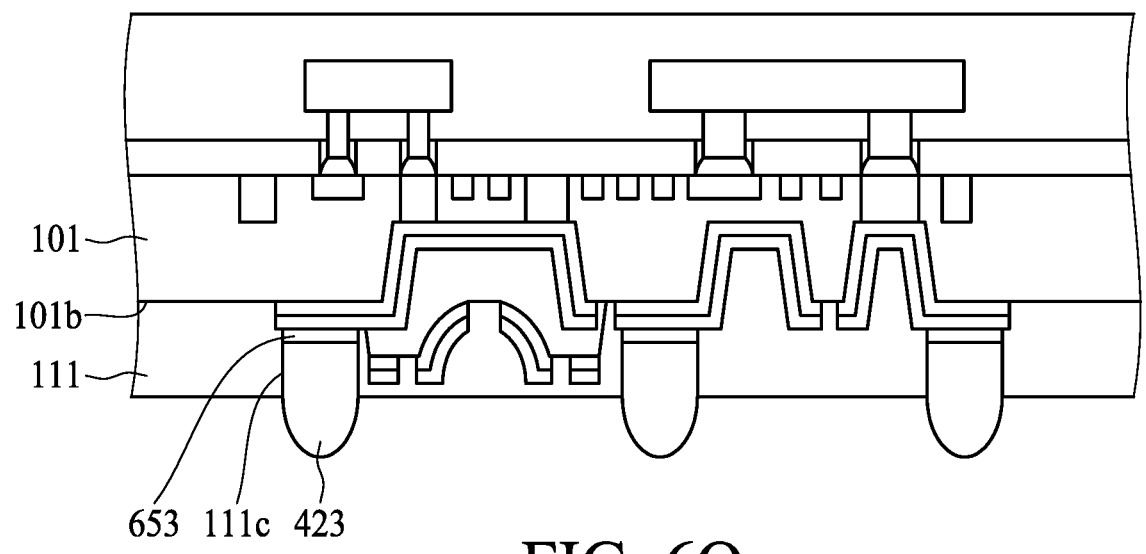

FIGS. 6A-6O illustrate a method for manufacturing a semiconductor substrate such as the semiconductor substrate 500 of FIG. 5.

Referring to FIG. 6A, a carrier 625 is provided. The carrier 625 has a first carrier surface 625a and a second carrier surface 625b opposite to the first carrier surface 625a. A first metal layer 627, 628 may be disposed on the second carrier surface 625b and the first carrier surface 625a of the carrier. The first metal layer 627, 628 may be disposed by a deposition technique, a sputtering technique, or a plating technique. In some embodiments, the first metal layer 627, 628 is disposed by a plating technique. In some embodiments, the first metal layer 627, 628 is disposed by a physical vapor deposition technique. The first metal layer 627, 628 may be a metal seed layer.

Referring to FIG. 6B, a first conductive trace 629, 630 is disposed on the first metal layer 627, 628. The first conducive trace 629, 630 may be disposed by patterning a first masking layer over a surface of the first metal layer 627, 628. In some embodiments, the first conducive trace 629, 630 is disposed by a combination of a photolithography technique, a plating technique, and an etching technique.

Referring to FIG. 6C, a second conductive trace 631, 632 is disposed on the first metal layer 627, 628. The second conductive trace 631, 632 is disposed with a thickness different from that of the first conductive trace 629, 630. In some embodiments, the second conductive trace 631, 632 is disposed with a thickness greater than the first conductive trace 629, 630. The second conductive trace 631, 632 may be disposed around the first conductive traces 629, 630. The second conducive trace 631, 632 may be disposed by patterning a second masking layer over the surface of the first metal layer 627, 628 and covering the first conductive trace 629, 630. In some embodiments, the second conducive trace 631, 632 is disposed by a combination of a photolithography technique, a plating technique, and an etching technique.

Referring to FIG. 6D, a dielectric layer 633, 634 is disposed on the first metal layer 627, 628. The dielectric layer 633, 634 covers the first conductive traces 629, 630 and the second conductive traces 631, 632. The dielectric layer may be disposed by, for example, a lamination technique.

An opening 633c, 634c is formed in the dielectric layer 633, 634, which exposes the second conductive trace 631, 632. The opening 633c, 634c may have a depth about one fourth of the thickness H of the dielectric layer 101, about one third of the thickness H of the dielectric layer 101, about a half of the thickness H of the dielectric layer 101, about two third of the thickness H of the dielectric layer 101, or about three fourth of the thickness H of the dielectric layer 101. The opening 633c, 634c may accommodate one or more first conductive trace 629, 630 and/or one or more second conductive trace 631, 632. The opening 633c, 634c may be formed by patterning the dielectric layer 633, 634 until a top surface of the second conductive trace 631, 632 is exposed. In some embodiments, a photolithography process and an etching process are performed to remove a predetermined portion of the dielectric layer 633, 634 to form the opening 633c, 634c in the dielectric layer 633, 634.

In addition, a second metal layer 635, 636 is disposed on the dielectric layer 633, 634. In some embodiments, the second metal layer 635, 636 is disposed in lining with the side walls of the opening 633c, 634c of the dielectric layer 633, 634. The second metal layer 635, 636 may be disposed by a deposition technique, a sputtering technique, or a plating technique. In some embodiments, the second metal layer 635, 636 is disposed by a plating technique. In some embodiments, the second metal layer 635, 636 is disposed by a physical vapor deposition technique. The second metal layer 635, 636 may be a metal seed layer.

Referring to FIG. 6E, a first solder mask 637, 638 is disposed on the second metal layer 635, 636. The first solder mask 637, 638 defines an opening 637c, 638c exposing a portion of the second metal layer 635, 636. The first solder mask 637, 638 may be disposed by, for example, a lamination technique. The opening 637c, 638c may be formed by a photolithography technique and an etching technique.

A third metal layer 639, 640 is disposed in the opening 637c, 638c defined by the first solder mask 637, 638. The third metal layer 639, 640 may be disposed by a deposition technique, a sputtering technique, or a plating technique. In some embodiments, the third metal layer 639, 640 is disposed by a plating technique. In some embodiments, the third metal layer 639, 640 is disposed by a physical vapor deposition technique.

Referring to FIG. 6F, the first solder mask 637, 638 is removed together with the underlying second metal layer 635, 636. The removal of the solder mask 637, 638 and the underlying second metal layer 635, 636 can be processed by, for example, an etching technique. Subsequently, a conductive via 205, 206 can be obtained.

Referring to FIG. 6G, an isolation layer 641, 642 is disposed on the conductive via 205, 206. In some embodiments, the isolation layer 641, 642 is disposed in the opening 205c, 206c of the conductive via 205, 206. The isolation layer 641, 642 may be disposed in lining with the shape of the conductive via 205, 206. The isolation layer 641, 642 may be formed by, for example, a combination of a photolithography technique, a spin coating technique, and an etching technique.

Referring to FIG. 6H, a fourth metal layer 643, 644 is disposed on the isolation layer 641, 642, the third metal layer 639, 640, and a portion of the dielectric layer 633, 634. The fourth metal layer 643, 644 may be disposed in lining with the shape of the third metal layer 639, 640. The fourth metal layer 643, 644 may be disposed by a deposition technique, a sputtering technique, or a plating technique. In some embodiments, the fourth metal layer 643, 644 is disposed by a plating technique. In some embodiments, the fourth metal layer 643, 644 is disposed by a physical vapor deposition technique.

Referring to FIG. 6I, a second solder mask 645, 646 is disposed on the fourth metal layer 643, 644. The second solder mask 645, 646 defines an opening 645c, 646c exposing a portion of the fourth metal layer 643, 644. The second solder mask 645, 646 may be disposed by, for example, a lamination technique. The opening 645c, 646c may be formed by a photolithography technique and an etching technique.

In addition, a fifth metal layer 647, 648 is disposed on the exposed portion of the fourth metal layer 643, 644. In some embodiments, the fifth metal layer 647, 648 is disposed in lining with the shape of the third metal layer 643, 644. The fifth metal layer 647, 648 may be disposed by a deposition technique, a sputtering technique, or a plating technique. In some embodiments, the fifth metal layer 647, 648 is disposed by a plating technique. In some embodiments, the fifth metal layer 647, 648 is disposed by a physical vapor deposition technique.

Referring to FIG. 6J, the second solder mask 645, 646 is removed together with the underlying fourth metal layer 643, 644. The removal of the solder mask 645, 646 and the underlying fourth metal layer 643, 644 can be processed by, for example, an etching technique. Subsequently, a fourth conductive trace 317, 318 can be obtained.

Referring to FIG. 6K, after removal of the second solder mask 645, 646 from the carrier 625, a semiconductor substrate 649, 650 before disposing a first protective layer 107 as illustrated in FIG. 1 can be obtained.

Referring to FIG. 6L, a sixth metal layer may be disposed on the first metal layer 627 by depositing metal particles 651, such as by, for example, a deposition technique, a sputtering technique, or a plating technique.

Referring to FIG. 6M, a first protective layer 107 is disposed adjacent to the first dielectric surface 101a of the dielectric layer 101. The first protective layer 107 may define a first protective opening 107c exposing the first conductive trace 103. A first bonding pad 655 for electrical connection may be disposed in the opening 107c of the first protective layer 107 and electrically connects to the first conductive trace 103. The first protective layer 107 may be disposed by, for example, a lamination technique. The opening 107c may be formed by a photolithography technique and an etching technique.

In addition, a second protective layer 111 is disposed adjacent to the second dielectric surface 101b of the dielectric layer 101. The second protective layer 111 may define a second protective opening 111c exposing the second conductive trace 104. A second bonding pad 653 for electrical connection may be disposed in the opening 111c of the second protective layer 111 and electrically connects to the second conductive trace 104. The second conductive trace 104 may electrically connect to the conductive via 205. The second protective layer 111 may be disposed by, for example, a lamination technique. The opening 111c may be formed by a photolithography technique and an etching technique.

Referring to FIG. 6N, at least one semiconductor element 517a, 517b is disposed adjacent to the first dielectric surface 101a of the dielectric layer 101. In some embodiments, the semiconductor element 517a, 517b is disposed adjacent to the first conductive trace 103. The semiconductor element 517a, 517b may be electrically connected to the dielectric layer 101 by disposing at least one conductive terminal 519a, 519b on the exposed portion of the first bonding pad 655. The conductive terminal 519a, 519b may be a pillar structure, which may include an under bump metallization (UBM) layer, a pillar, a barrier layer, and a solder layer. In some embodiments, the conductive terminal 519a, 519b is formed by, for example, a combination of a physical vapor deposition, plating, photolithography, etching, solder reflowing, or other suitable processes.

In addition, an encapsulant 521 is disposed adjacent to the first dielectric surface 101a of the dielectric layer 101. The encapsulant 521 may cover a portion of the first protective layer 107 and a portion or the entire top surface of the semiconductor element 517a, 517b. The encapsulant 521 may be formed by, for example, a molding technique.

Referring to FIG. 6O, at least one electrical connector 423 is disposed adjacent to the second dielectric surface 101b of the dielectric layer 101. In some embodiments, the electrical connector 423 is disposed adjacent to the second protective layer 111. In some embodiments, the electrical connector 423 is disposed on the portion of the second bonding pad 653 exposed by the second protective opening 111c of the second protective layer 111 for external connection. The electrical connector 423 may be a solder ball, which may be formed by, for example, a solder ball placement technique or a solder paste printing technique, followed by a reflowing technique.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 μm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor substrate, comprising:
   a dielectric layer having a first surface and a second surface opposite to the first surface;
   a first conductive trace disposed in the dielectric layer and closer to the first surface of the dielectric layer than to the second surface of the dielectric layer; and
   a first conductive via disposed in the dielectric layer and closer to the second surface of the dielectric layer than to the first surface of the dielectric layer and connected to the first conductive trace,
   wherein a width of the first conductive trace is smaller than a height of the first conductive trace.

2. The semiconductor substrate of claim 1, wherein a depth of the first conductive via is greater than a thickness of the first conductive trace.

3. The semiconductor substrate of claim 2, wherein a bottom surface of the first conducive via contacts a bottom surface of the first conductive trace and a width of the bottom surface of the first conductive via is greater than a width of the bottom surface of the first conductive trace.

4. The semiconductor substrate of claim 3, wherein the depth of the first conductive via is greater than the width of the bottom surface of the first conductive via.

5. The semiconductor substrate of claim 4, wherein the bottom surface of the first conductive via is closer to the first surface of the dielectric layer than to the second surface of the dielectric layer.

6. The semiconductor substrate of claim 5, wherein the first conductive via has an opening having a width reducing toward the first conductive trace.

7. The semiconductor substrate of claim 6, further comprising:
   a second conductive trace disposed in the dielectric layer and closer to the first surface of the dielectric layer than to the second surface of the dielectric layer; and
   a second conductive via disposed in the dielectric layer and closer to the second surface of the dielectric layer than to the first surface of the dielectric layer and connected to the second conductive trace, wherein a bottom surface of the second conductive trace is substantially level with the bottom surface of the first conductive trace.

8. The semiconductor substrate of claim 7, wherein a width of a bottom surface of the second conductive via is substantially the same with that of the first conductive via.

9. The semiconductor substrate of claim 8, wherein a width of the second conductive trace is greater than that of the first conductive trace.

10. A semiconductor substrate, comprising:
   a dielectric layer having a first surface and a second surface opposite to the first surface;
   a first conductive trace disposed in the dielectric layer and closer to the first surface of the dielectric layer than to the second surface of the dielectric layer;
   a second conductive trace disposed in the dielectric layer and closer to the first surface of the dielectric layer than to the second surface of the dielectric layer; and
   a conductive via disposed in the dielectric layer and closer to the second surface of the dielectric layer than to the first surface of the dielectric layer, wherein the conductive via is entirely a continuous structure and contacts the first conductive trace and the second conductive trace.

11. The semiconductor substrate of claim 10, wherein a bottom surface of the conductive via contacts a first bottom surface of the first conductive trace and a second bottom surface of the second conductive trace, wherein the first bottom surface is substantially level with the second bottom surface.

12. The semiconductor substrate of claim 11, wherein a thickness of the first conductive trace is greater than a width of the first conductive trace, and a thickness of the second conductive trace is greater than a width of the second conductive trace.

13. The semiconductor substrate of claim 12, wherein a depth of the conductive via is greater than the thickness of the first conductive trace or the thickness of the second conductive trace.

14. The semiconductor substrate of claim 13, wherein a width of the bottom surface of the conductive via is greater than a sum of a width of the first bottom surface of the first conductive trace and a width of the second bottom surface of the second conductive trace.

15. The semiconductor substrate of claim 14, wherein the depth of the conductive via is smaller than the width of the bottom surface of the conductive via.

16. The semiconductor substrate of claim 15, wherein the conductive via has an opening having a width reducing toward the first conductive trace.

17. The semiconductor substrate of claim 16, further comprising a third conductive trace disposed between the first conductive trace and the second conductive trace and at least partially in a projection area of the bottom surface of the conductive via on the first surface of the dielectric layer.

18. The semiconductor substrate of claim 17, further comprising a second dielectric layer disposed on the second surface of the first dielectric layer, wherein the second dielectric layer has a third bottom surface comprising a dimple overlapping with the conductive via.

19. The semiconductor substrate of claim 18, further comprising a metal layer disposed on the dimple of the third bottom surface.

* * * * *